(12) United States Patent
Ma et al.

(10) Patent No.: US 11,222,983 B2
(45) Date of Patent: Jan. 11, 2022

(54) DISPLAY SUBSTRATE, MANUFACTURING METHOD THEREOF, AND DISPLAY DEVICE

(71) Applicants: Hefei Xinsheng Optoelectronics Technology Co. Ltd., Hefei (CN); BOE Technology Group Co., Ltd., Beijing (CN)

(72) Inventors: Tao Ma, Beijing (CN); Yunlong Wang, Beijing (CN); Chengshao Yang, Beijing (CN); Yu Ji, Beijing (CN); Shengli Liu, Beijing (CN)

(73) Assignees: Hefei Xinsheng Optoelectronics Technology Co. Ltd., Hefei (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 16/825,999

(22) Filed: Mar. 20, 2020

(65) Prior Publication Data
US 2021/0036161 A1    Feb. 4, 2021

(30) Foreign Application Priority Data
Jul. 30, 2019   (CN) .......................... 201910695857.2

(51) Int. Cl.
*H01L 29/786*    (2006.01)
*H01L 27/12*    (2006.01)

(52) U.S. Cl.
CPC ...... *H01L 29/78618* (2013.01); *H01L 27/127* (2013.01); *H01L 27/1222* (2013.01)

(58) Field of Classification Search
None
See application file for complete search history.

(56) References Cited

U.S. PATENT DOCUMENTS

| 2017/0222059 A1* | 8/2017 | Chen ................. G02F 1/134309 |
| 2017/0243896 A1* | 8/2017 | Zhang ................ G02F 1/13439 |
| 2019/0088788 A1* | 3/2019 | Ban ................... H01L 29/42384 |

* cited by examiner

*Primary Examiner* — Steven M Christopher
(74) *Attorney, Agent, or Firm* — Arent Fox LLP; Michael Fainberg

(57) ABSTRACT

The present disclosure provides a display substrate, a manufacturing method thereof, and a display device. The display substrate includes a base substrate and thin-film transistors disposed on the base substrate, where the thin-film transistors each comprises a gate, an active layer insulated from the gate, and two ohmic contact parts in direct contact with the active layer, leaving a gap region between the two ohmic contact parts; and each of the ohmic contact parts comprises a lightly doped region and a heavily doped region, and an orthographic projection of the lightly doped region on the base substrate and an orthographic projection of the heavily doped region on the base substrate do not overlap each other.

9 Claims, 5 Drawing Sheets

DISPLAY SUBSTRATE, MANUFACTURING METHOD THEREOF, AND DISPLAY DEVICE

CROSS REFERENCE TO RELATED APPLICATION

This application claims priority to Chinese Patent Application No. 201910695857.2, filed with the Chinese Patent Office on Jul. 30, 2019. The entire disclosure of the above application is incorporated herein by reference.

FIELD

The present disclosure relates to the field of display technology, and more particularly to a display substrate, a manufacturing method, thereof, and a display device.

BACKGROUND

With the rapid development of display technology, high-resolution display products have now become a mainstream in the market. Properties of a thin-film transistor (TFT) are key factors that influence the product resolution, and the magnitude of a leakage current of the thin-film transistor directly influences the quality of a display substrate.

SUMMARY

Embodiments of the present disclosure provide a display substrate, a manufacturing method thereof, and a display device.

In a first aspect, an embodiment of the present disclosure provides a display substrate, comprising a base substrate and thin-film transistors disposed on the base substrate, where the thin-film transistors each comprises a gate, an active layer insulated from the gate, and two ohmic contact parts in direct contact with the active layer, leaving a gap region between the two ohmic contact parts; and each of the ohmic contact parts comprises a lightly doped region and a heavily doped region, and an orthographic projection of the lightly doped region on the base substrate and an orthographic projection of the heavily doped region on the base substrate do not overlap each other.

In some embodiments, an orthographic projection of the gate on the base substrate and the orthographic projection of the heavily doped region on the base substrate have an overlapping region.

In some embodiments, the lightly doped region comprises a first lightly doped region, which is located at a side of the heavily doped region away from the center of the active layer.

In some embodiments, an orthographic projection of the first lightly doped region on the base substrate and the orthographic projection of the gate on the base substrate do not overlap each other.

In some embodiments, an orthographic projection of the first lightly doped region on the base substrate and the orthographic projection of the gate on the base substrate have an overlapping region.

In some embodiments, the lightly doped region further comprises a second lightly doped region, which is located at a side of the heavily doped region close to the center of the active layer.

In some embodiments, a doping concentration of the first lightly doped region is same as that of the second lightly doped region.

In some embodiments, the thin-film transistor further includes a source and a drain;

an orthographic projection of the source on the base substrate covers an orthographic projection of one of the ohmic contact parts on the base substrate, and the source is in direct contact with the one of the ohmic contact parts; and an orthographic projection of the drain on the base substrate covers an orthographic projection of the other of the ohmic contact parts on the base substrate, and the drain is in direct contact with the other one of the ohmic contact parts.

In some embodiments, the two ohmic contact parts in the thin-film transistor are symmetrically disposed with respect to the center of the active layer.

In some embodiments, the ohmic contact parts are made of an N-type semiconductor material.

In a second aspect, an embodiment of the present disclosure provides a manufacturing method of the aforementioned display substrate, including:

forming a pattern of an active layer on a base substrate;

forming ohmic contact layer on the pattern of the active layer, and performing doping on the ohmic contact layer to form a lightly doped region and a heavily doped region, where an orthographic projection of the lightly doped region on the base substrate and an orthographic projection of the heavily doped region on the base substrate do not overlap each other; and patterning the ohmic contact layer.

In some embodiments, during performing doping on the ohmic contact parts to form a lightly doped region, the method further includes:

forming a second lightly doped region, where the heavily doped region is located between the first lightly doped region and the second lightly doped region.

In some embodiments, performing doping on the ohmic contact parts includes:

shielding the ohmic contact layer in regions except for the first lightly doped region and the second lightly doped region to be formed, and performing light doping on the ohmic contact layer; and shielding the first lightly doped region and the second lightly doped region of the ohmic contact layer, and performing heavy doping on the ohmic contact layer.

In some embodiments, performing doping on the ohmic contact layer includes:

performing light doping on the ohmic contact layer; and shielding the first lightly doped region and the second lightly doped region of the ohmic contact layer, and performing heavy doping on the ohmic contact layer.

In some embodiments, after forming ohmic contact layer on the pattern of the active layer, and performing doping on the ohmic contact layer, and before patterning the ohmic contact layer, the method further includes:

forming a source and a drain on the ohmic contact layer; and patterning the ohmic contact layer comprises:

etching the ohmic contact layer by using patterns of the source and drain as a shield, and etching a portion of the active layer.

In a third aspect, an embodiment of the present disclosure provides a display device. The display device includes the aforementioned display substrate.

DETAILED DESCRIPTION OF THE EMBODIMENTS

Figure 1:
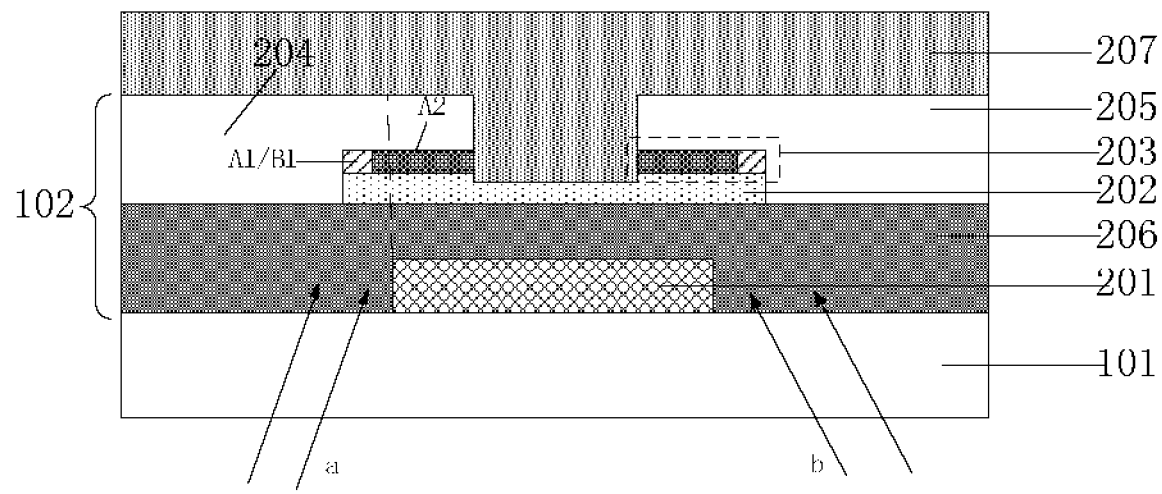
FIG. 1 is a schematic structural diagram of a display substrate according to an embodiment of the present disclosure.

In the related art, for a thin-film transistor device having a heavily doped ohmic contact part, during use of the thin-film transistor, light is irradiated onto the ohmic contact part of the thin-film transistor, and carriers at grain boundaries are emitted to a drain under the action of an electric field and light irradiation, leading to a larger leakage current, so that an input image cannot be maintained to the arrival of the next signal, resulting in bad display.

In view of the problem of bad display caused by a larger leakage current of a thin-film transistor in the related art, embodiments of the present disclosure provide a display substrate, a manufacturing method thereof, and a display device.

Embodiments of the display substrate, the manufacturing method thereof, and the display device provided in the present disclosure will be described in detail below in conjunction with the accompanying drawings. The thickness and shape of each film layer in the drawings do not reflect the true scale, and are merely intended to illustrate the present disclosure.

In a first aspect, an embodiment of the present disclosure provides a display substrate, as shown in FIG. 1, including a base substrate 101 and thin-film transistors 102 disposed on the base substrate 101, where:

the thin-film transistors 102 each includes a gate 201, an active layer 202 insulated from the gate, and two ohmic contact parts 203 in direct contact with the active layer 202, leaving a gap region between the two ohmic contact parts 203; and each of the ohmic contact parts 203 includes a lightly doped region A1 and a heavily doped region A2, and an orthographic projection of the lightly doped region A1 on the base substrate 101 and an orthographic projection of the heavily doped region A2 on the base substrate 101 do not overlap each other.

In a display substrate provided in the related art, the entire ohmic contact part is heavily doped, such that the leakage current of the thin-film transistor is increased, which, if serious, can affect the display quality. In the display substrate provided in the embodiment of the present disclosure, the ohmic contact part is divided into a lightly doped region and a heavily doped region, where a doping concentration of the lightly doped region is less than that of the heavily doped region. Due to the presence of the lightly doped region, a carrier concentration of the thin-film transistor can be reduced, thereby reducing the leakage current and improving the display quality.

The heavily doped region is provided in the ohmic contact part to allow a good contact between the active layer and a source (or drain).

In addition, providing the lightly doped region in the ohmic contact part is approximate to increasing the channel length which also reduces the leakage current to some extent, so that an input image can be maintained to the arrival of the next signal, and good display of the display substrate is ensured.

The aforementioned display substrate provided in the embodiment of the present disclosure may be applied to a liquid crystal display device, and the aforementioned thin-film transistor may be a driving transistor; and the display substrate may also be applied to an organic electroluminescent display device, and the aforementioned thin-film transistor may also be a switching transistor. The type of the thin-film transistor is not limited here. Furthermore, generally a display substrate may have a plurality of thin-film transistors, and the number of thin-film transistor(s) is not limited here.

In some embodiments, in the display substrate provided in the embodiment of the present disclosure, as shown in FIG. 1, an orthographic projection of the gate 201 on the base substrate 101 and the orthographic projection of the heavily doped region A2 on the base substrate 101 have an overlapping region.

As shown in FIG. 1, the orthographic projection of the heavily doped region A2 of the ohmic contact part 203 on the base substrate 101 and the orthographic projection of the gate 201 on the base substrate 101 have an overlapping region, and the gate 201 can shield light emitted from a side of the base substrate 101 toward the interior of the display substrate, such as light a and light b in the figure, so the heavily doped region A2 of the ohmic contact part 203 is not irradiated by the light incident from the side of the base substrate 101 to produce photo-generated carriers. By providing the lightly doped region A1 in the ohmic contact part 203, the photo-generated carriers generated due to irradiation of the lightly doped region A1 by the light emitted from the side of the base substrate 101 toward the interior of the display substrate can be reduced, thereby reducing the leakage current.

In some embodiments, the active layer 202 can be fabricated by using MLA (Micro Lens Array) technology. The MLA technology refers to superposition of a plurality of sets of micro lenses to achieve the laser emergence with a high energy density. In some embodiments, the active layer is formed on a gate insulating layer 206 by using amorphous silicon (a-Si), and the active layer is crystallized by using a mask formed by superposition of a plurality of sets of micro lenses, to cause melting and recrystallization at places irradiated by a laser beam, so that a channel region of the thin-film transistor is selectively converted from amorphous silicon to polysilicon (p-Si) to improve the mobility of the active layer.

Figure 2:
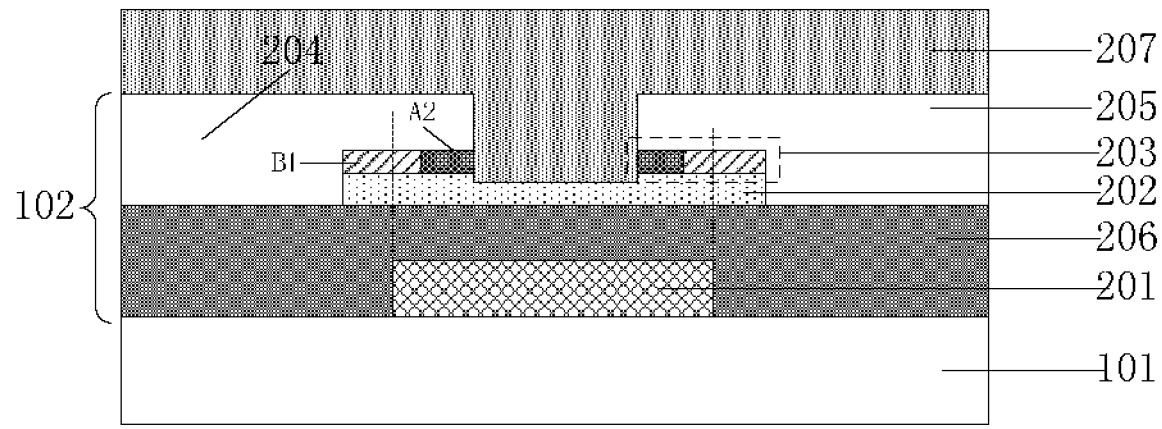
FIG. 2 is another schematic structural diagram of a display substrate according to an embodiment of the present disclosure.

In some embodiments, in the display substrate provided in the embodiment of the present disclosure, as shown in FIGS. 1 and 2, the lightly doped region A1 includes a first lightly doped region B1, here the first lightly doped region B1 is located at a side of the heavily doped region A2 away from the center of the active layer 202.

As the first lightly doped region B1 is located at the side of the heavily doped region A2 away from the center of the active layer 202, for example, the first lightly doped region B1 is disposed on the left side of the left-side ohmic contact part 203 or on the right side of the right-side ohmic contact part 203 in the figure, it can be seen obviously from FIG. 1 that the ohmic contact part 203 has a larger contact area with the source 204 (or the drain 205) at the outer side as compared with the lightly doped region A1 of the ohmic contact part 203 provided in other region. Therefore, providing the first lightly doped region B1 on the side of the ohmic contact part 203 away from the center of the active layer 202 can increase the area ratio of the first lightly doped region in the ohmic contact part, and correspondingly reduce the area ratio of the heavily doped region in the ohmic contact part, so that the leakage current can be further reduced.

As shown in FIG. 1, an orthographic projection of the first lightly doped region B1 on the base substrate 101 and the orthographic projection of the gate 201 on the base substrate 101 do not overlap each other. With this arrangement, an overlapped area of the orthographic projection of the heavily doped region A2 on the base substrate 101 and the orthographic projection of the gate 201 on the base substrate 101 can be increased, and the light irradiated from the side of the base substrate 101 to the heavily doped region A2 can be reduced, thereby reducing the leakage current.

As shown in FIG. 2, the orthographic projection of the first lightly doped region B1 on the base substrate 101 and the orthographic projection of the gate 201 on the base substrate 101 have an overlapping region. With this arrangement, the orthographic projection of the gate 201 on the base substrate 101 can cover the orthographic projection of the heavily doped region A2 on the base substrate 101. Due to the shielding by the gate 201, the light from the side of the base substrate 101 is not irradiated on the heavily doped region A2, so as to reduce the leakage current. Furthermore, this arrangement can increase the area ratio of the lightly doped region A1 in the ohmic contact part 203, correspondingly reduce the area ratio of the heavily doped region A2 in the ohmic contact part 203, and further reduce the leakage current of the thin-film transistor.

Figure 3:
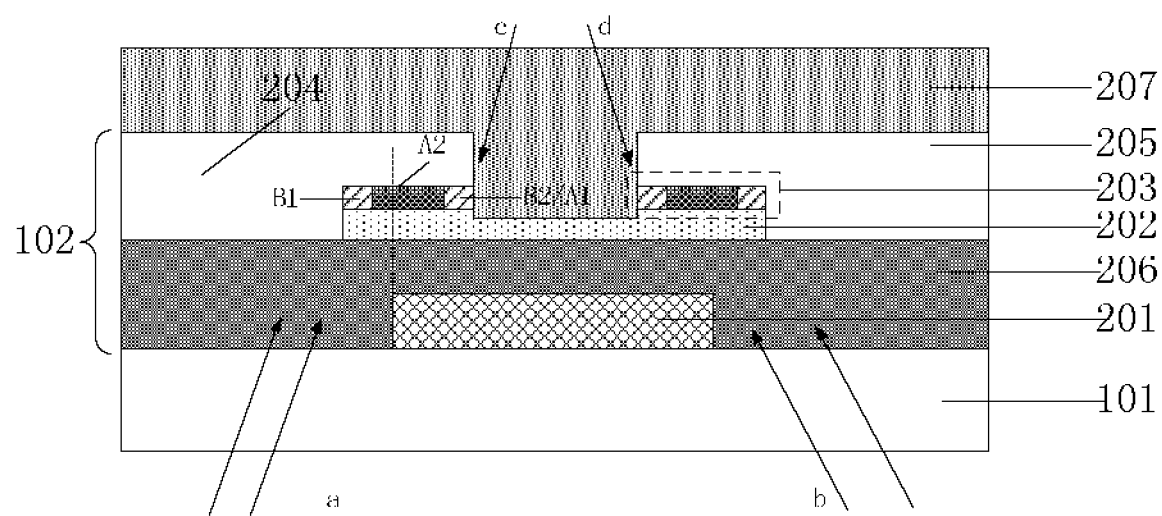
FIG. 3 is yet another schematic structural diagram of a display substrate according to an embodiment of the present disclosure.

In some embodiments, in the aforementioned display substrate provided in the embodiment of the present disclosure, as shown in FIG. 3, the lightly doped region A1 further includes a second lightly doped region B2, and the second lightly doped region B2 is located at a side of the heavily doped region A2 close to the center of the active layer.

By providing the second lightly doped region, the area ratio of the lightly doped region in the ohmic contact part can be further increased, thereby reducing the leakage current. Furthermore, by providing the second lightly doped region in the ohmic contact part, the channel length is further increased, and the leakage current is further reduced, so that the input image can be maintained to the arrival of the next signal, and good display of the display substrate is ensured.

The second lightly doped region B2 can be disposed on a side of the heavily doped region A2 close to the center of the active layer 202; that is, in the lightly doped region consisting of the first lightly doped region B1 and the second lightly doped region B2, a portion can be shielded by the gate 201, and the other portion is not shielded by the gate 201, so that the area of the first lightly doped region not shielded by the gate can be maximized, and the leakage current is effectively reduced.

It should be noted that, in the display substrate provided in the embodiment of the present disclosure, the first lightly doped region and the second lightly doped region may be formed by the same process; that is, a doping concentration of the first lightly doped region is same as that of the second lightly doped region. Of course, the first lightly doped region and the second lightly doped region may also be formed by different processes, so that the doping concentration of the first lightly doped region is different from that of the second lightly doped region. This can be selected according to actual needs, and is not specifically limited here.

In some embodiments, in the aforementioned display substrate provided in the embodiment of the present disclosure, as shown in FIGS. 1 to 3, the thin-film transistor 102 further includes a source 204 and a drain 205.

The orthographic projection of the source 204 on the base substrate 101 covers an orthographic projection of one of the ohmic contact parts 203 on the base substrate 101, and the source is in direct contact with the ohmic contact part 203; and The orthographic projection of the drain 205 on the base substrate 101 covers an orthographic projection of the other of the ohmic contact parts 203 on the base substrate 101, and the drain is in direct contact with the ohmic contact part 203.

In the thin-film transistor, the two ohmic contact parts can be symmetrically disposed with respect to the center of the active layer. For example, positions of the first lightly doped regions in the two ohmic contact parts can be set symmetrically, and positions of the second lightly doped regions in the two ohmic contact parts can be set symmetrically. In this way, the carrier concentration distribution in the two ohmic contact parts can be substantially same, so that the thin-film transistor has better performance.

It should be noted that, in the embodiment of the present disclosure, as shown in FIGS. 2 and 3, to provide the first lightly doped region B1 and the second lightly doped region B2 in the ohmic contact part 203, it also needs to meet the condition that ohmic contact part 203 also includes a heavily doped region other than the first lightly doped region B1 and the second lightly doped region B2 to ensure a good contact between the active layer and the source (or drain).

In some embodiments in the display substrate provided in the embodiment of the present disclosure, the aforementioned ohmic contact part is an N-type semiconductor material. The type of the ohmic contact part can be determined according to actual needs. For example, in some embodiments, the ohmic contact part may also be a P-type semiconductor material, which is not limited herein.

In a second aspect, based on the same inventive concept, an embodiment of the present disclosure provides a manufacturing method of the aforementioned display substrate. The problem-solving principle of the manufacturing method is similar to that of the aforementioned display substrate, and thus for the implementation of the manufacturing method, reference can be made to the implementation of the aforementioned display substrate, and repeated description is omitted.

Figure 4:
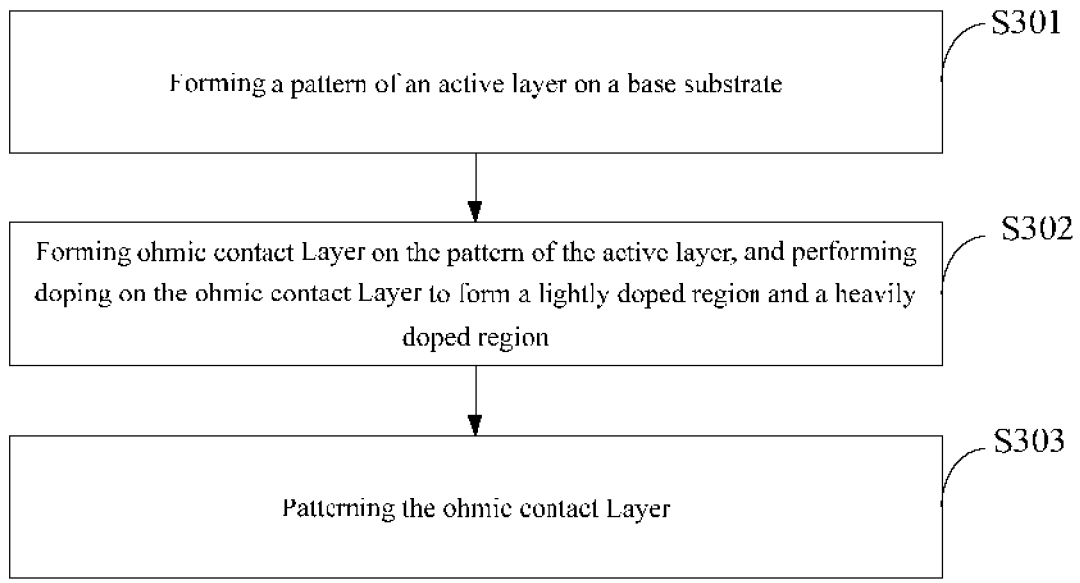
FIG. 4 is a schematic flow diagram of a manufacturing method of a display substrate according to an embodiment of the present disclosure.
Figure 6:
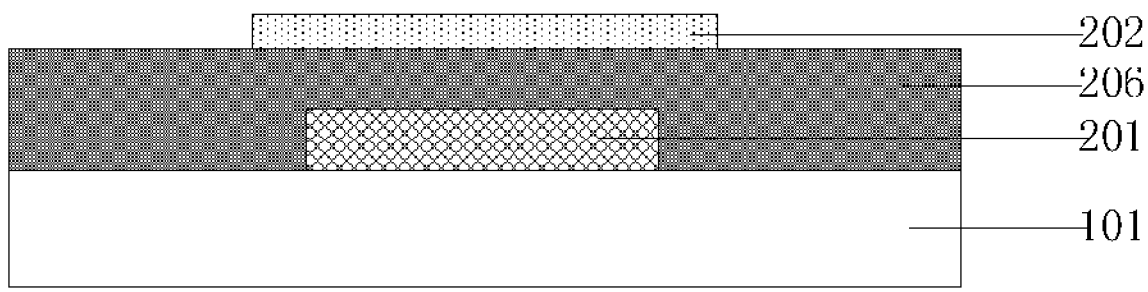
FIG. 6 is a schematic structural diagram of a display substrate with an active layer formed according to an embodiment of the present disclosure.
Figure 7A:
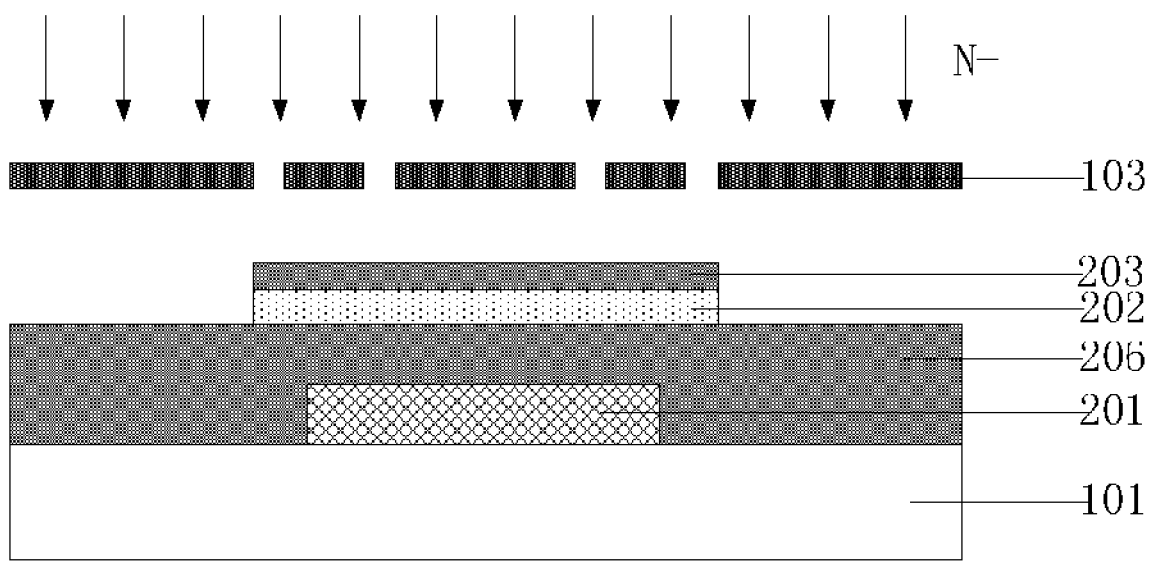
FIGS. 7A to 7D are respective schematic structural diagrams corresponding to respective steps in a doping method according to an embodiment of the present disclosure.
Figure 7B:
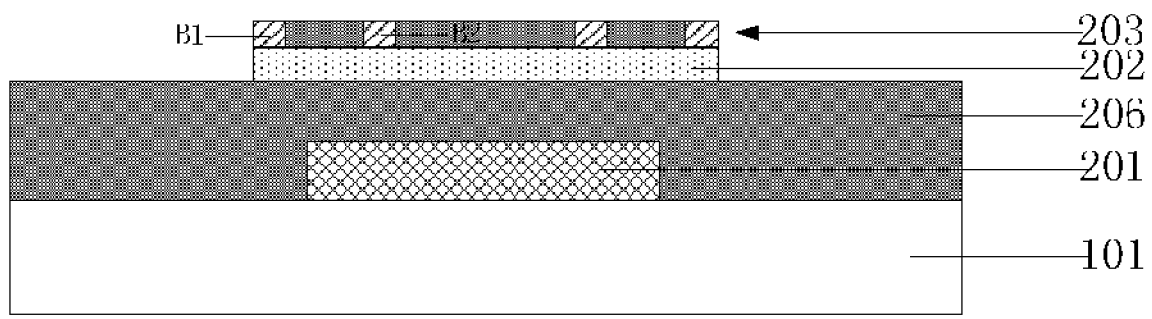
Figure 7C:
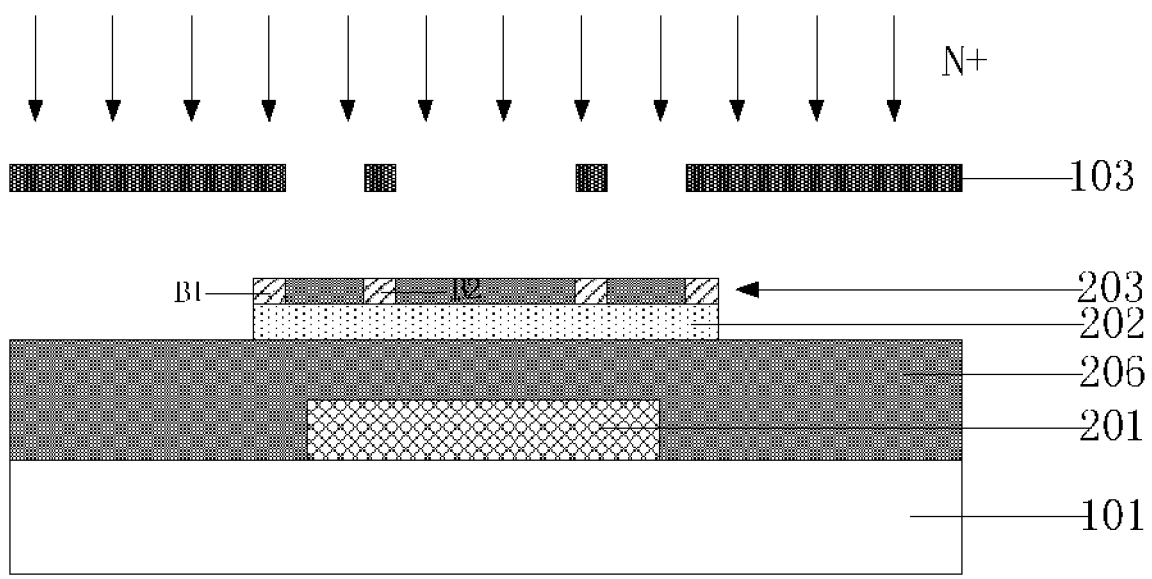
Figure 7D:
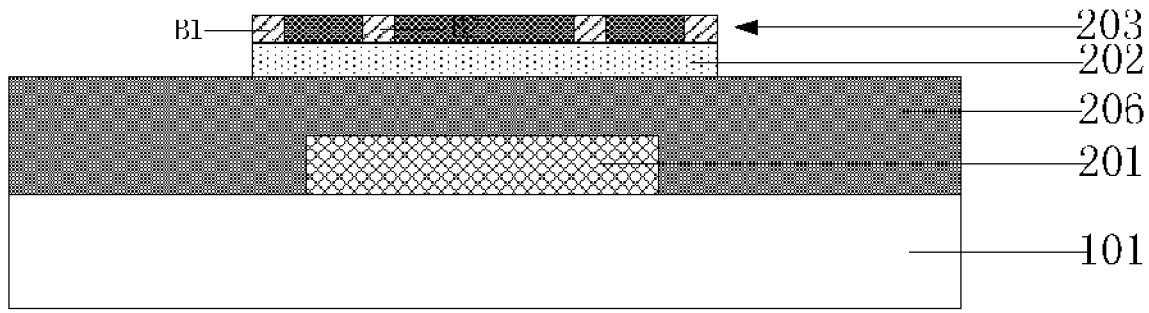
Figure 10:
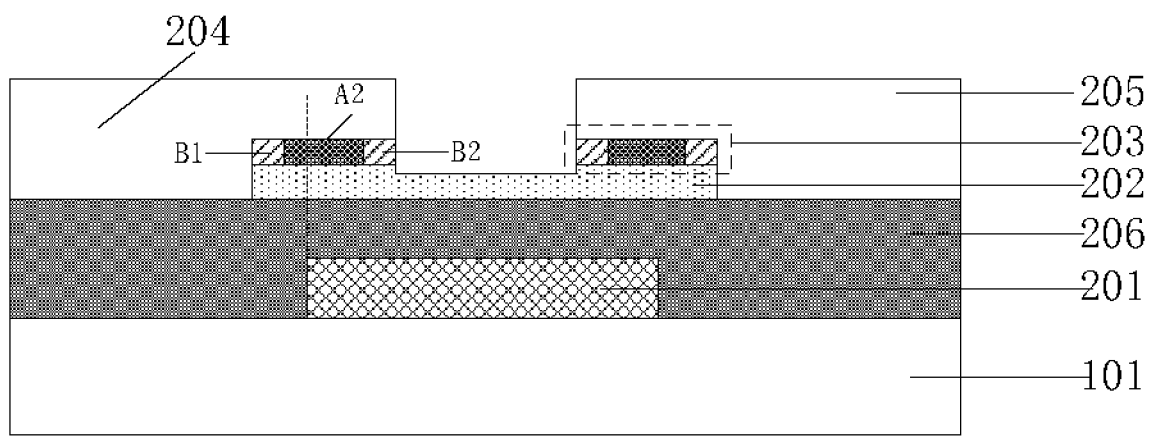
FIG. 10 is a schematic structural diagram after patterning of ohmic contact parts according to an embodiment of the present disclosure.

An embodiment of the present disclosure provides a manufacturing method of the aforementioned display substrate, as shown in FIG. 4, including:

S301: with reference to FIG. 6, forming a pattern of an active layer 202 on a base substrate 101;

S302: forming ohmic contact layer 203 on the pattern of the active layer 202, and performing doping on the ohmic contact layer 203 to form a lightly doped region A1 and a heavily doped region A2, as shown in FIG. 7D; and S303: patterning the ohmic contact layer 203 to obtain a structure as shown in FIG. 10.

In the aforementioned manufacturing method provided in the embodiment of the present disclosure, doping is performed on the ohmic contact parts to form a lightly doped region in addition to a heavily doped region in each ohmic contact part. Therefore, the number of photo-generated carriers generated under the action of light irradiation or an electric field is smaller, so that the carriers emitted to the drain are reduced, and the leakage current can be effectively reduced. Furthermore, this also increases the channel length, and also reduces the leakage current to some extent, so that the input image can be maintained to the arrival of the next signal, and good display of the display substrate is ensured.

Figure 5:
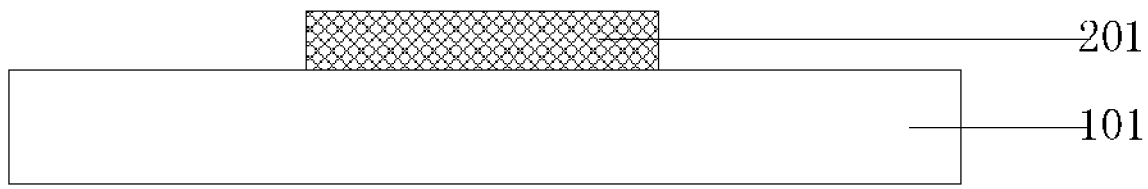
FIG. 5 is a schematic structural diagram of a display substrate with a gate formed according to an implementation of the present disclosure.

In some embodiments, before the above step S301, the method further includes: as shown in FIG. 5, forming a pattern of a gate 201 on the base substrate 101, and as shown in FIG. 6, forming a gate insulation layer 206 on a layer where the gate 201 is located.

Also referring to FIG. 6, in the above step S301, the active layer is formed on the gate insulating layer 206 by using amorphous silicon (a-Si), and the active layer is crystallized by using a mask formed by superposition of a plurality of sets of micro lenses, to cause melting and recrystallization at places irradiated by a laser beam, so that a channel region of the thin-film transistor is selectively converted from amorphous silicon to polysilicon (p-Si) to improve the mobility of the active layer.

In some embodiments, in the aforementioned manufacturing method provided in the embodiment of the present disclosure, in the above step S302, while performing doping on the ohmic contact parts to form a lightly doped region, the method can further includes:

forming a second lightly doped region, where the heavily doped region is located between the first lightly doped region and the second lightly doped region.

In some embodiments, during the doping process, the first lightly doped region and the second lightly doped region are formed at the same time, so that one doping process can be omitted, and the manufacturing cost is saved.

In the above step S302, as shown in FIG. 7A, the ohmic contact layer 203 can be made of amorphous silicon material, and the pattern of the ohmic contact layer 203 formed on the pattern of the active layer 202 is consistent with the pattern of the active layer 202, to prevent the subsequent doping process from affecting the active layer 202.

In some embodiments, in the aforementioned manufacturing method provided in the embodiment of the present disclosure, in the above step S302, performing doping on the ohmic contact parts can include:

shielding the ohmic contact layer 203 in regions except for the first lightly doped region and the second lightly doped region to be formed, and performing light doping on the ohmic contact layer, as shown in FIG. 7A, the ohmic contact layer 203 is shielded by a mask 103, and lightly doped to obtain a structure shown in FIG. 7B, that is, forming a first lightly doped region B1 and a second lightly doped region B2; and shielding the first lightly doped region B1 and the second lightly doped region B2 of the ohmic contact layer 203, and performing heavy doping on the ohmic contact layer 203, as shown in FIG. 7C, the ohmic contact layer 203 is shielded by a mask 103 and doped to obtain a structure shown in FIG. 7D, and form a heavily doped region in the regions of the ohmic contact layer 203 except for the first lightly doped region B1 and the second lightly doped region B2.

Figure 8A:
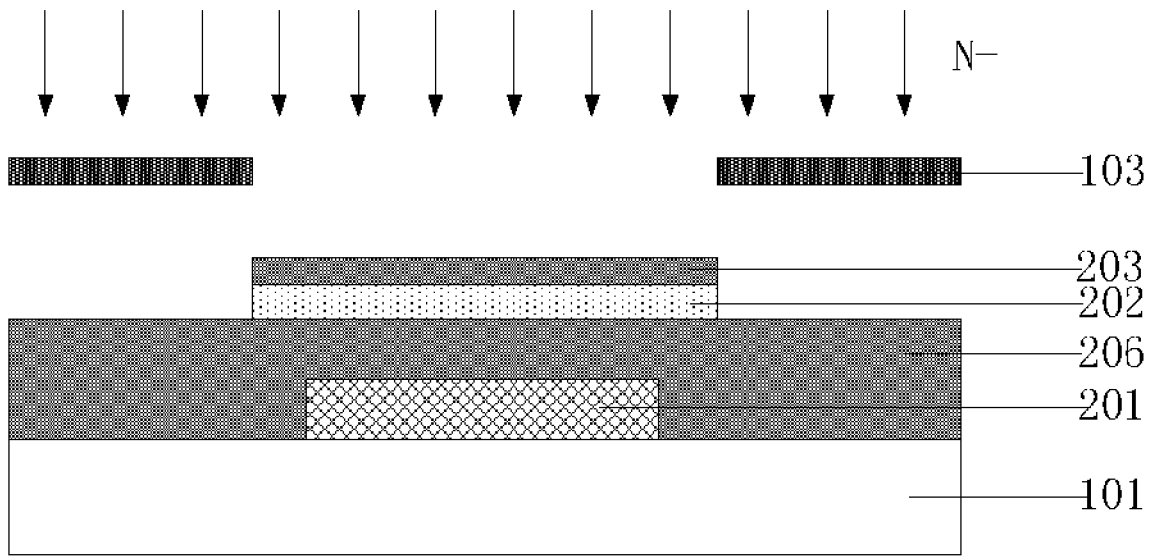
FIGS. 8A to 8C are respective schematic structural diagrams corresponding to respective steps in another doping method according to an embodiment of the present disclosure.
Figure 8B:
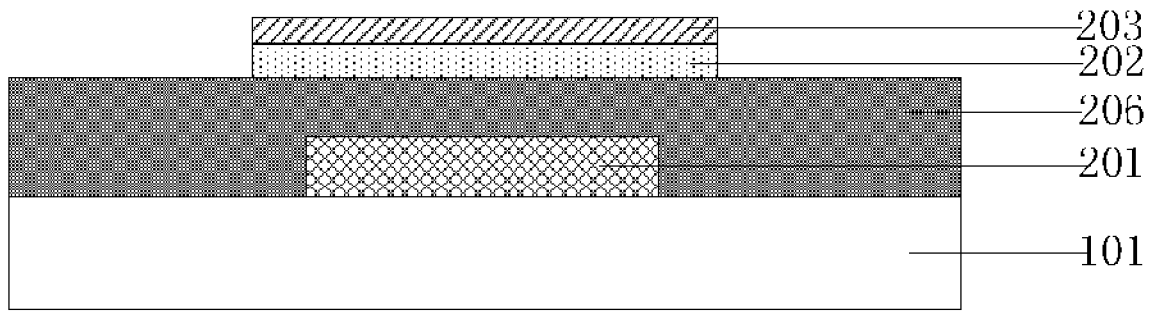
Figure 8C:
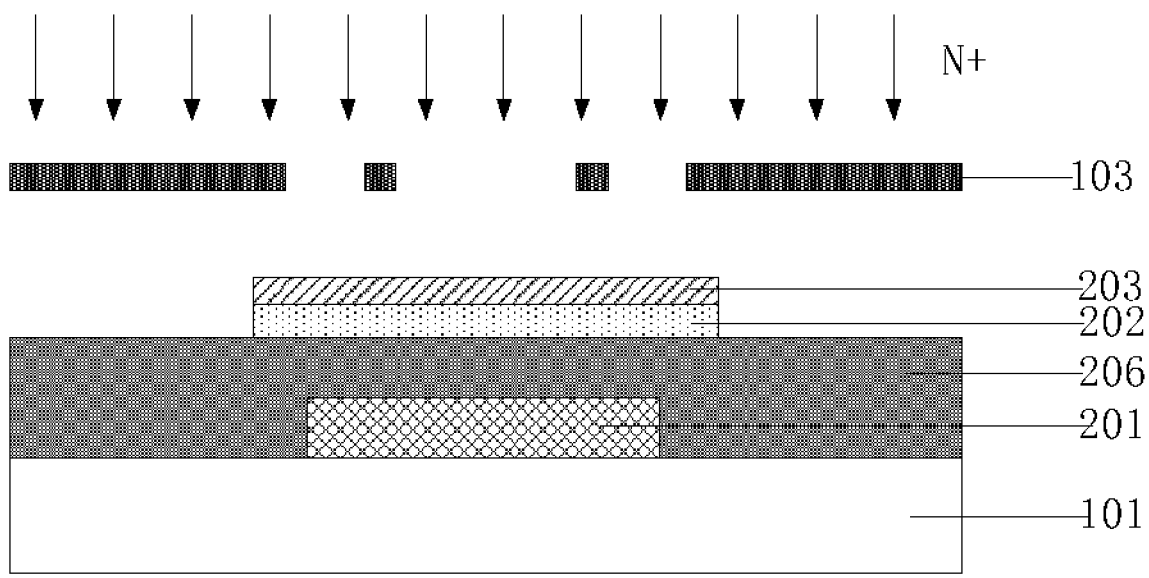

In some embodiments, in the aforementioned manufacturing method provided in the embodiment of the present disclosure, in the above step S302, the ohmic contact layer may also be doped by the following steps, including:

performing light doping on the ohmic contact layer 203, as shown in FIG. 8A, regions except for the ohmic contact layer 203 are shielded by a mask 103 to perform light doping on the ohmic contact layer 203, to obtain a structure shown in FIG. 8B; and shielding the first lightly doped region B1 and the second lightly doped region B2 of the ohmic contact layer 203, and performing heavy doping on the ohmic contact layer 203, as shown in FIG. 8C, the ohmic contact part is shielded by a mask 103 and heavily doped to obtain a structure shown in FIG. 7D.

Figure 9:
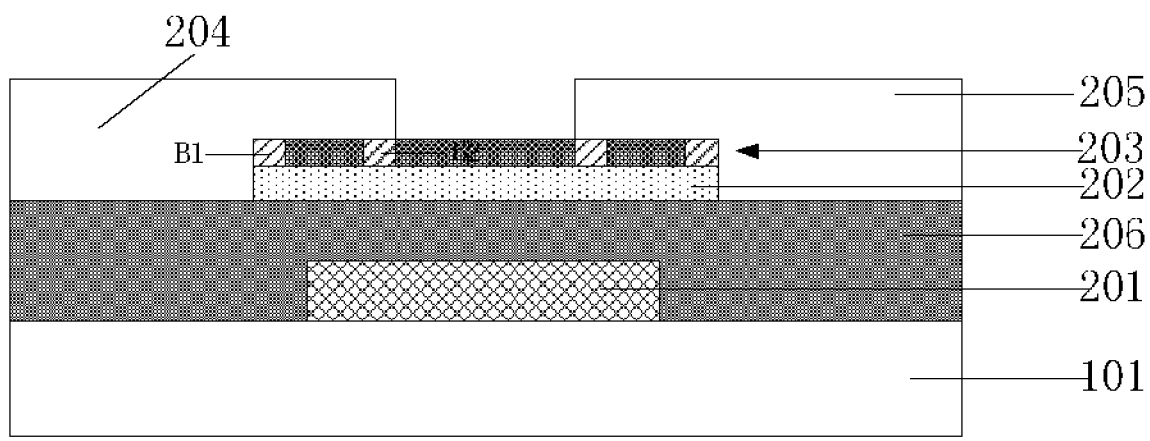
FIG. 9 is a schematic structural diagram of a display substrate with a source and a drain formed according to an embodiment of the present disclosure.

In some embodiments, in the aforementioned manufacturing method provided in the embodiment of the present disclosure, after the above step S302 and before the above step S303, the method can further include:

forming a source 204 and a drain 205 on the ohmic contact layer 203, as shown in FIG. 9.

The above step S303 can include:

etching the ohmic contact layer 203 by using patterns of the source 204 and drain 205 as a shield to form the two ohmic contact parts, and etching a portion of the active layer 202, as shown in FIG. 10.

In the embodiment of the present disclosure, the ohmic contact part is etched by using the source and the drain as a shield, without using a mask, thus reducing the manufacturing cost. Furthermore, during the etching process, a portion of the active layer is etched, so that the source and drain can be prevented from being electrically connected and the performance of the thin-film transistor is improved.

After the above step S303, the method can further include:

forming a pattern of a passivation layer 207 on a film layer where the source 204 is located to obtain a structure shown in FIG. 3.

It should be noted that, in the manufacturing method provided in the embodiment of the present disclosure, the structure shown in FIG. 3 is used as an example for illustration in FIGS. 7A to 7D, FIGS. 8A to 8C, FIG. 9 and FIG. 10. In specific implementation, in manufacturing of the display substrate in other structure, the pattern of the mask can be adjusted according to the shape of the actual patterns of the first lightly doped region and the second lightly doped region, and specific manufacturing steps can be performed according to the above steps.

In a third aspect, based on the same inventive concept, an embodiment of the present disclosure provides a display device including the aforementioned display substrate. The display device can be applied to a mobile phone, a tablet computer, a television, a display, a notebook computer, a digital photo frame, a navigator, or any other product or component with a display function. The problem solving principle of the display device is similar to that of the aforementioned display substrate, and thus for the implementation of the display device, reference can be made to the implementation of the aforementioned display substrate, and repeated description is omitted.

In the display substrate, the manufacturing method thereof and the display device provided in the embodiments of the present disclosure, the ohmic contact part is divided into a lightly doped region and a heavily doped region, where a doping concentration of the lightly doped region is less than that of the heavily doped region. Due to the presence of the lightly doped region, the number of photo-generated carriers generated under the action of light irradiation or an electric field is smaller, so that the carriers emitted to the drain are reduced, and the leakage current can be effectively reduced. In addition, providing the lightly doped region in the ohmic contact part is equivalent to increasing the channel length and also reduces the leakage current to some extent.

Evidently those skilled in the art can make various modifications and variations to the present disclosure without departing from the spirit and scope of the present disclosure. Thus the present disclosure is also intended to encompass these modifications and variations thereto so long as the modifications and variations come into the scope of the claims appended to the present disclosure and their equivalents.

The invention claimed is:

1. A display substrate, comprising a base substrate and thin-film transistors disposed on the base substrate, wherein
the thin-film transistors each comprises a gate, an active layer insulated from the gate, and two ohmic contact parts in direct contact with the active layer, leaving a gap region between the two ohmic contact parts; and
each of the ohmic contact parts comprises a lightly doped region and a heavily doped region, and an orthographic projection of the lightly doped region on the base substrate and an orthographic projection of the heavily doped region on the base substrate do not overlap each other;
wherein an orthographic projection of the gate on the base substrate and the orthographic projection of the heavily doped region on the base substrate have an overlapping region; and
wherein the lightly doped region comprises a first lightly doped region, and the first lightly doped region is located at a side of the heavily doped region away from a center of the active layer.

2. The display substrate according to claim 1, wherein an orthographic projection of the first lightly doped region on the base substrate and the orthographic projection of the gate on the base substrate do not overlap each other.

3. The display substrate according to claim 1, wherein an orthographic projection of the first lightly doped region on the base substrate and the orthographic projection of the gate on the base substrate have an overlapping region.

4. The display substrate according to claim 1, wherein the lightly doped region further comprises a second lightly doped region, and the second lightly doped region is located at a side of the heavily doped region close to the center of the active layer.

5. The display substrate according to claim 4, wherein a doping concentration of the first lightly doped region is same as that of the second lightly doped region.

6. The display substrate according to claim 1, wherein the thin-film transistors each further comprises a source and a drain;
an orthographic projection of the source on the base substrate covers an orthographic projection of one of the ohmic contact parts on the base substrate, and the source is in direct contact with the one of the ohmic contact parts; and
an orthographic projection of the drain on the base substrate covers an orthographic projection of another one of the ohmic contact parts on the base substrate, and the drain is in direct contact with the another one of the ohmic contact parts.

7. The display substrate according to claim 1, wherein the two ohmic contact parts in each of the thin-film transistors are symmetrically disposed with respect to a center of the active layer.

8. The display substrate according to claim 1, wherein the ohmic contact parts are made of an N-type semiconductor material.

9. A display device, comprising the display substrate of claim 1.

* * * * *